(12) United States Patent
Conn et al.

(10) Patent No.: US 9,207,721 B2
(45) Date of Patent: Dec. 8, 2015

(54) GEARED LATCH APPARATUS

(75) Inventors: Kevin D. Conn, Montgomery, TX (US); Robert Martinez, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 462 days.

(21) Appl. No.: 13/056,096

(22) PCT Filed: Jul. 31, 2008

(86) PCT No.: PCT/US2008/071854
§ 371 (c)(1), (2), (4) Date: Jan. 26, 2011

(87) PCT Pub. No.: WO2010/014108
PCT Pub. Date: Feb. 4, 2010

(65) Prior Publication Data
US 2011/0127895 A1 Jun. 2, 2011

(51) Int. Cl.
E05C 1/02 (2006.01)
G06F 1/18 (2006.01)
H05K 5/02 (2006.01)
H05K 7/14 (2006.01)

(52) U.S. Cl.
CPC .............. *G06F 1/181* (2013.01); *H05K 5/0221* (2013.01); *H05K 7/1487* (2013.01)

(58) Field of Classification Search
CPC ............. E05C 5/00; E05C 9/041; E05C 1/04; E05C 1/08
USPC ................ 292/58, 160, 172, 142, 279, 1, 137
See application file for complete search history.

(56) References Cited

U.S. PATENT DOCUMENTS

| | | | |
|---|---|---|---|
| 5,010,426 A | 4/1991 | Krenz | |
| 5,325,263 A | 6/1994 | Singer et al. | |
| 5,975,735 A | 11/1999 | Schmitt | |
| 6,483,710 B1 * | 11/2002 | Reasoner et al. | 361/726 |
| 6,929,338 B2 | 8/2005 | Chang | |
| 7,325,846 B2 * | 2/2008 | Smith et al. | 292/336.3 |
| 7,782,611 B2 * | 8/2010 | Yeh et al. | 361/679.57 |
| 7,843,698 B2 * | 11/2010 | Takizawa et al. | 361/732 |
| 2007/0252393 A1 * | 11/2007 | Wollacott et al. | 292/173 |
| 2007/0253993 A1 | 11/2007 | Bruer | |

FOREIGN PATENT DOCUMENTS

CN 1993666 A 7/2007

OTHER PUBLICATIONS

International Search Report and Written Opinion, dated Apr. 27, 2009, 11 pages.

* cited by examiner

*Primary Examiner* — Kristina Fulton
*Assistant Examiner* — Nathan Cumar
(74) *Attorney, Agent, or Firm* — Conley Rose, P.C.

(57) ABSTRACT

In at least some embodiments, an apparatus is provided that comprises a frame and a cover removably attached to the frame. The apparatus further comprises a geared latch assembly attached to the cover, the geared latch assembly having a geared latch. If the geared latch is rotated from a first position to a second position, the cover moves linearly from a closed state to an open state.

16 Claims, 5 Drawing Sheets

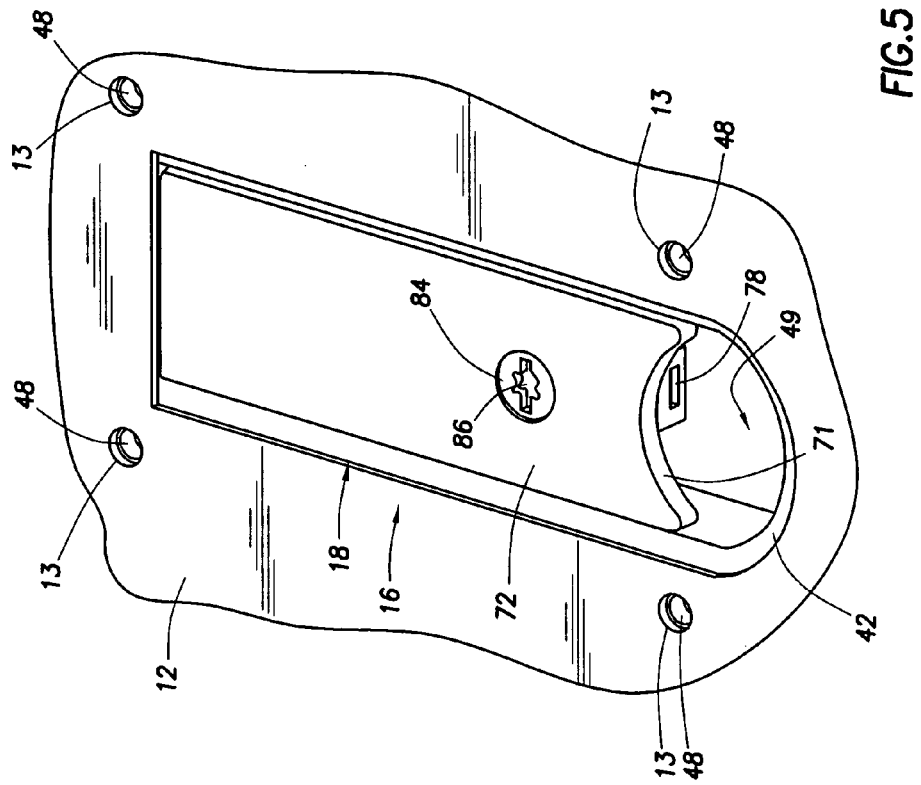
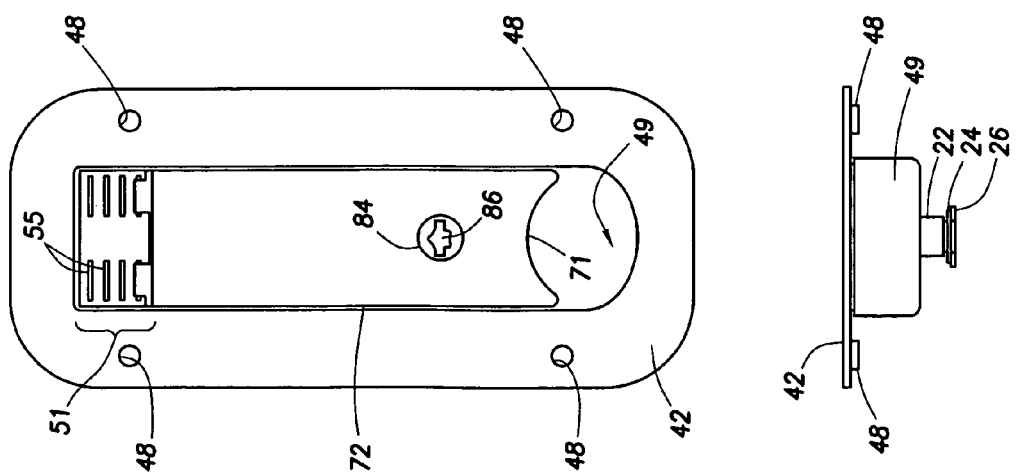

GEARED LATCH APPARATUS

BACKGROUND

Electronic devices, such as computer systems, often have a removable panel or cover to provide access to components and circuitry disposed within a housing. These removable covers are generally coupled to the housing by a threaded fastener, such as a screw, or other tool-based fasteners. Unfortunately, tool-based fasteners involve a considerable amount of time and effort to remove or attach. Also, screws can become lost.

BRIEF DESCRIPTION OF THE DRAWINGS

Embodiments will hereafter be described with reference to the accompanying drawings, wherein like reference numerals denote like elements, and:

FIG. 3 shows a top view of the geared latch mechanism of FIG. 1 in an assembled state;

FIG. 4 shows a side view of the geared latch mechanism of FIG. 1;

FIG. 5 shows a perspective view of the geared latch mechanism of FIG. 1 in an assembled state and aligned with a device's access hood or cover in accordance with embodiments;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
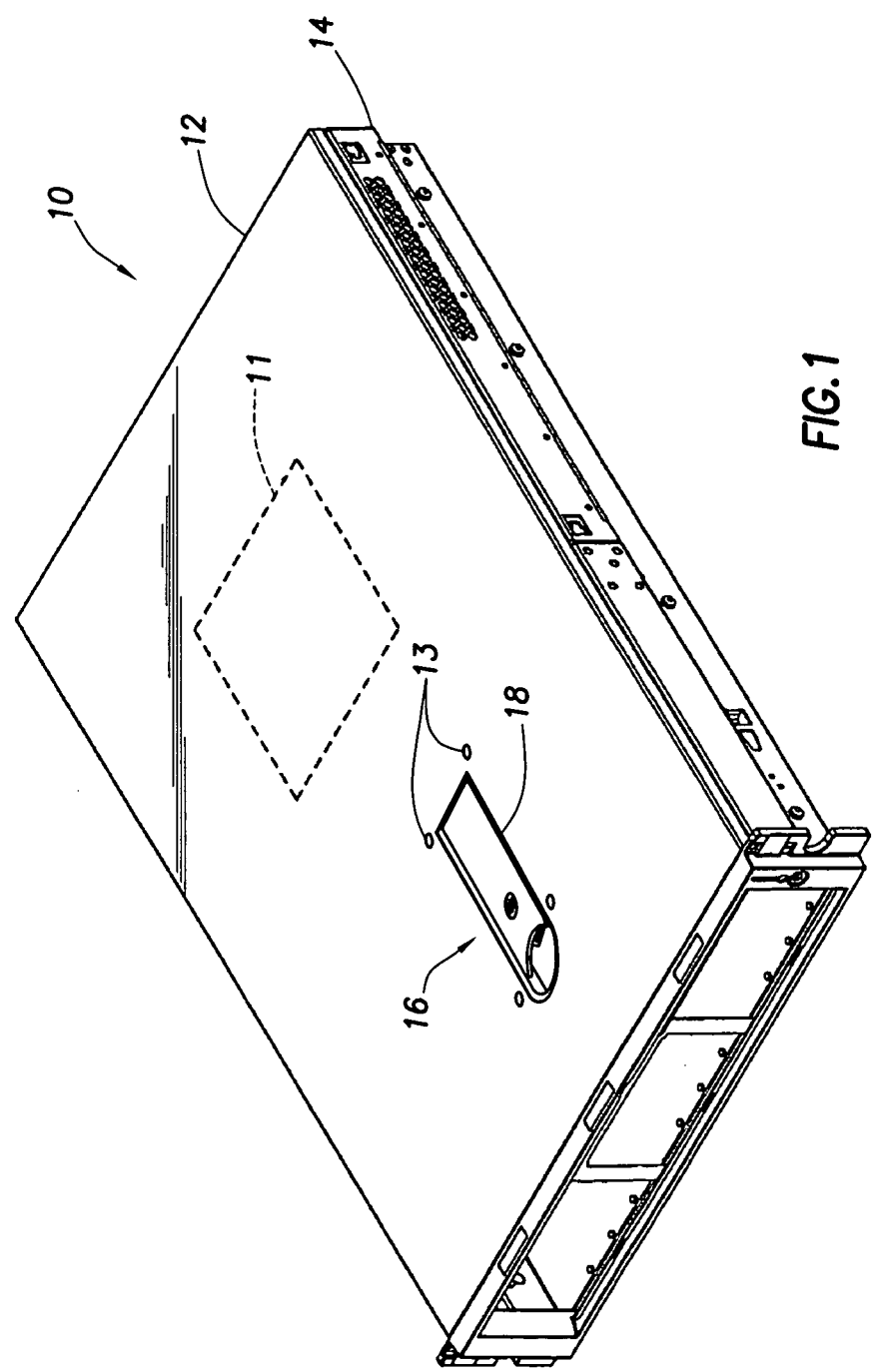
FIG. 1 shows a perspective view of a device having a geared latch mechanism in accordance with embodiments.

FIG. 1 shows a perspective view of a device 10 having a geared latch mechanism 16 in accordance with embodiments. The device 10 preferably corresponds to electronics and components, such as a desktop computer system, a rack mount computer system, a portable computer system, a peripheral device, a network device, a server, and so forth. As illustrated, the device 10 comprises an access hood or cover 12 removably coupled to a housing 14. The device 10 also comprises computing components 11 disposed inside the housing 14. If internal access is desired, then the geared latch mechanism 16 may be engaged to facilitate removal of the cover (i.e., access hood) 12.

In at least some embodiments, the geared latch mechanism 16 preferably comprises a receptacle 18 that attaches to the cover 12. As an example, the receptacle 18 may be fastened to or otherwise removably attached to the cover 12 using connection points 13. In a closed state, the other components of the geared latch mechanism 16 preferably fit partially or fully within the receptacle 18 for protection and/or to minimize interference with other components or devices. As discussed in further detail below, the geared latch mechanism 16 provides leverage to facilitate engagement and disengagement of a slidable interlock between the cover 12 and the housing 14. In this manner, the cover 12 may be attached or removed without tools and with minimal physical force or exertion by the user. It should be noted that the geared latch mechanism 16 may be configured for user-engagement or for automated engagement, such as by a motorized mechanism and a corresponding control system.

Figure 2:
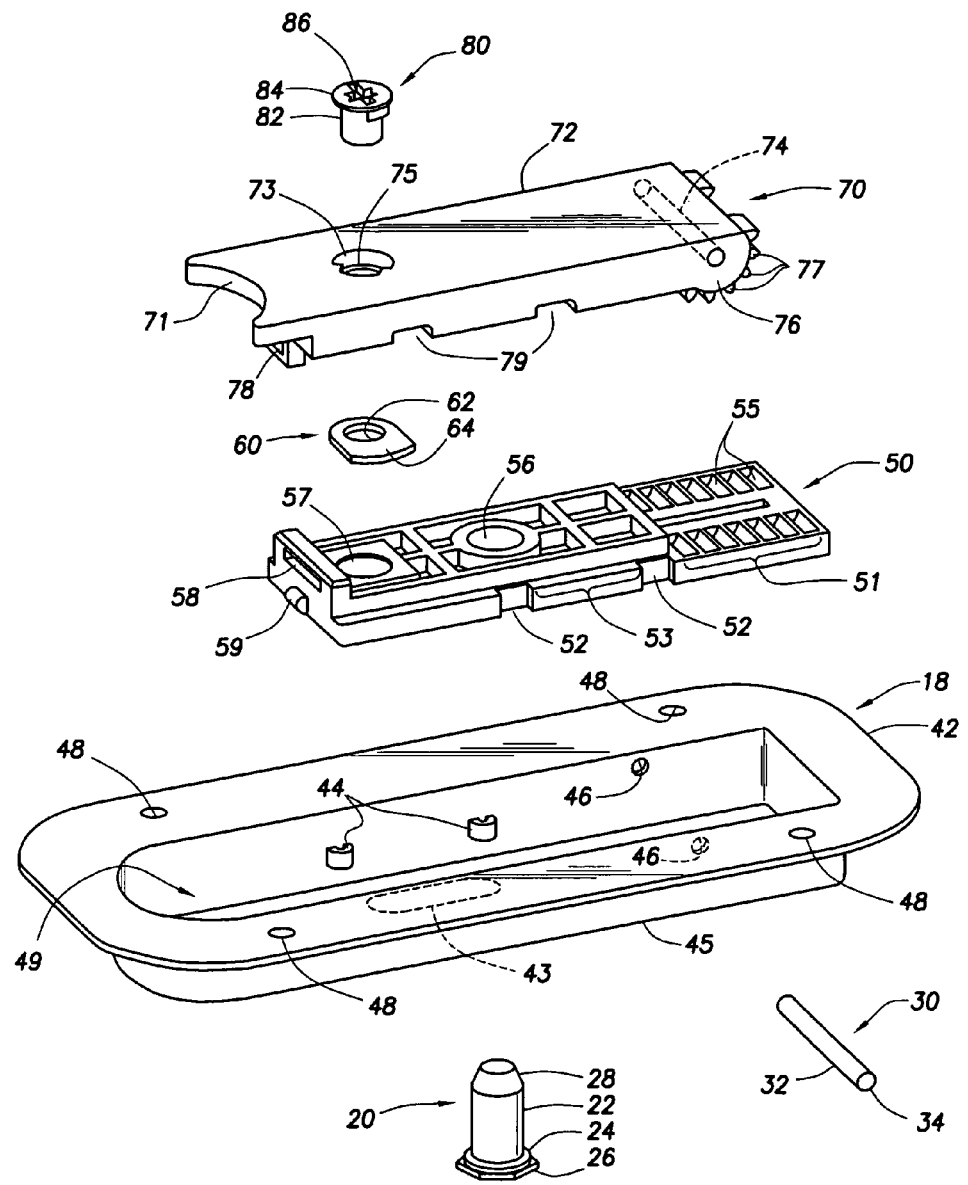
FIG. 2 shows an exploded perspective view of the geared latch mechanism of FIG. 1.

FIG. 2 shows an exploded perspective view of the geared latch mechanism 16 of FIG. 1 in accordance with embodiments. Also, FIGS. 3 and 4 respectively show a top view and a side view of the geared latch mechanism 16 of FIG. 1 in an assembled state.

As best shown in FIG. 2, at least some embodiments of the geared latch mechanism 16 comprise various components including, the receptacle 18, a geared latch 70 and a gear rack member 50. The geared latch mechanism 16 also preferably comprises various attachment components including, a static pin 20, a rotational pin 30, a locking member 60 and a rotator 80 associated with the locking member 60.

Specifically, the receptacle 18 previously described provides an open-ended housing or cup 49. In at least some embodiments, the receptacle 18 also comprises a rim 42 that extends around the cup 49, the rim 42 having connection points 48 corresponding to the connection points 13 of the cover 12 for fastening the receptacle 18 to the cover 12. Within the cup 49, various nubs 44 are preferably provided to align and/or to hold in place the gear rack member 50 or other components of the geared latch mechanism 16 as will later be described. Also shown are rotational pin receptacles 46 on opposite sides of the cup 49 and a longitudinal slot 43 extending along a base 45 of the cup 49. During assembly of the geared latch mechanism 16, the rotational pin 30 is inserted through the rotational pin receptacles 46. In some embodiments, the rotational pin 30 comprises a cylindrical body 32 with concave ends 34.

As best shown in FIG. 2, the gear rack member 50 comprises at least one gear rack path 51 having a plurality of gear rack teeth 55. The gear rack member 50 also comprises slots 52 that, if aligned with the nubs 44 of the cup 49, enable the gear rack member 50 to be inserted at a predetermined position within the cup 49. The gear rack member 50 also comprises recesses 56 and 57 that extend partially or fully through the gear rack member 50. Once aligned and inserted into the cup 49, the gear rack member 50 can be fixed in place by insertion of the static pin 20 into or through the recess 56.

Although other embodiments may vary, the static pin 20 of FIG. 2 comprises a conical portion 28, a first cylindrical portion 22, a second cylindrical portion 24, and a cap 26.

In at least some embodiments, the gear rack member 50 also comprises a slot 58 to receive the locking member 60 and a nub 59 configured to hold the geared latch 70 in a closed position unless a sufficient upward force is applied at the non-geared end 71. To hold the geared latch 70, the nub 59 of the gear rack member 50 is received by a slot 78 at the non-geared end 71 of the geared latch 70. To further prevent undesired activation of the geared latch 70, the locking member 60 can be turned such that a portion 64 of the locking member 60 extends into the slot 58 of the gear rack member 50. In at least some embodiments, turning the locking member 60 involves turning the rotator 80, which comprises a portion 82 that extends through an opening 73 of the geared latch 70 and into or through a corresponding recess 62 of the locking member 59. To turn the rotator 80, an appropriate tool (not shown) is inserted into a corresponding tool receiver 86. To maintain the rotator 80 approximately flush with the geared latch 70, a rim or shelf 75 in the opening 73 contacts a corresponding rim 84 of the rotator 80. If the non-circular portion 82 of the rotator 80 extends all the way through the locking member 60, the end of the non-circular portion 82 may be received by the recess 57 in the gear rack member 50.

In at least some embodiments, the geared latch 70 preferably comprises slots 79. In such embodiments, the slots 79 can be aligned with the nubs 44 of the cup 49 to facilitate assembly of the geared latch mechanism 16. Proper positioning of the geared latch 70 with respect to the gear rack member 50 ensures that the geared end 76 of the geared latch 70 is aligned with the gear rack paths 51 of the gear rack member 50. Specifically, the gear teeth 77 at the geared end 76 mesh with the gear rack teeth 55 of the gear rack paths 51.

FIG. 5 shows a perspective view of the geared latch mechanism 16 of FIG. 1 in an assembled state and aligned with a device's cover 12 in accordance with embodiments. As shown in FIG. 5, the gear rack paths 51 and gear rack teeth 55 are preferably hidden beneath the cover 12 when the connections points 13 of the cover 12 are aligned with the connection points 48 of the receptacle 18.

As illustrated in the assembled view of FIG. 5, the various components of the geared latch mechanism 16 (e.g., the gear rack member 50, the geared latch 70 and other components) are preferably self-contained within the receptacle 18. It should also be noted that the geared latch mechanism 16 has a relatively low-profile attributed to the low-profile geometry of the various components (e.g., the gear rack member 50, the geared latch 70 and other components can fit within a receptacle that is preferably less than ½" deep). In at least some embodiments, the self-contained and low-profile assembly of the geared latch mechanism 16 may be achieved without any tools or tool-based fasteners. In such embodiments, even the attachment of the geared latch mechanism 16 to the cover 12 via connection points 13 and 48 may be achieved using manually inserted fasteners. Also, the rotator 80 and static pin 20 may be positioned manually. Alternatively, in various embodiments, some tool-based components may facilitate assembly and/or help to prevent unintentional manipulation of the geared latch mechanism 16.

Figure 6:
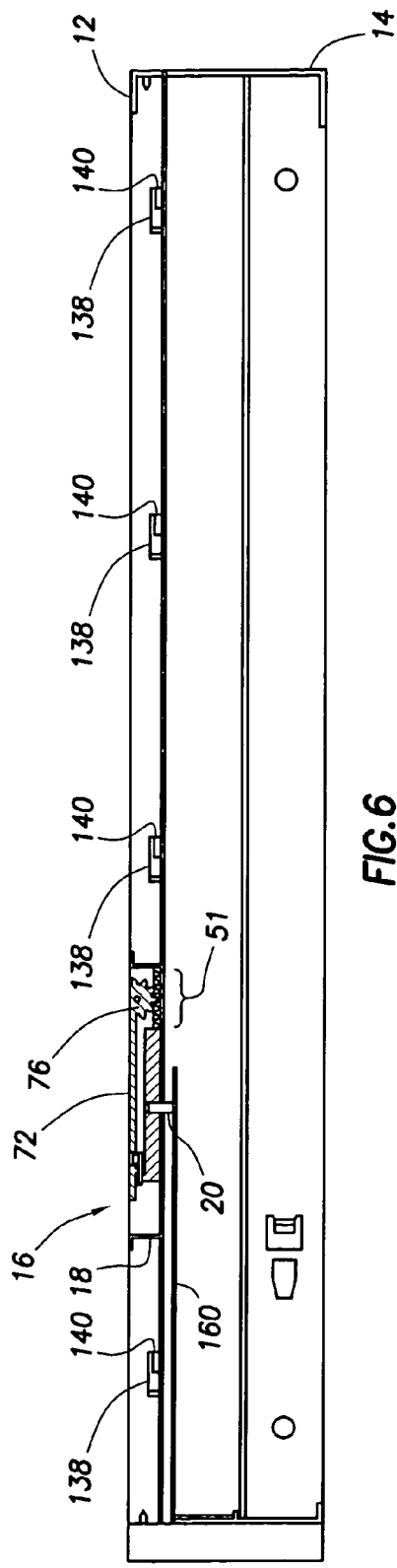
FIG. 6 shows a cross-sectional side view of a device with the geared latch mechanism in a closed state in accordance with embodiments.
Figure 7:
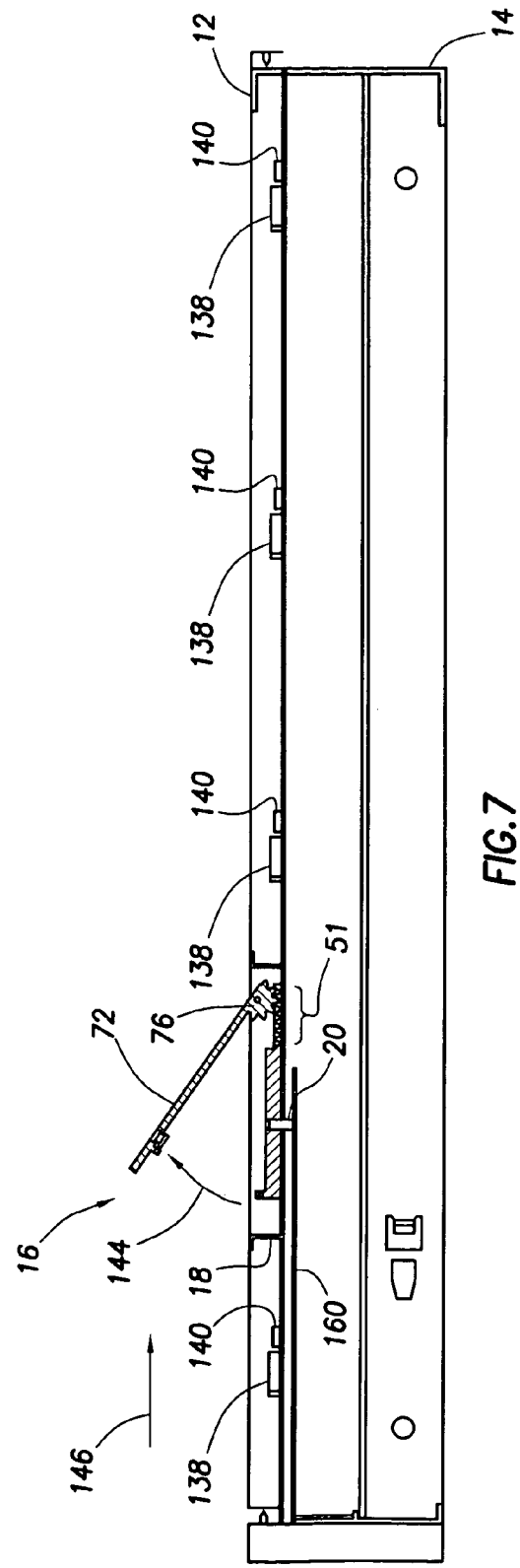
FIG. 7 shows a cross-sectional side view of a device with the geared latch mechanism in an open state in accordance with embodiments.

FIGS. 6 and 7 respectively show cross-sectional side views of a device with the geared latch mechanism 16 in a closed state and an open state in accordance with embodiments. As illustrated in FIG. 6, the cover 12 is removably coupled to the housing 14 via a plurality of hooks or latches 138 interlocked with corresponding receptacles or slots 140. The illustrated latches 138 are interlocked with the slots 140 by sliding engagement of the cover 12 along the top length of the housing 14 (e.g., in a leftward direction). A reverse motion (e.g., a rightward movement) of the cover 12 unlocks the latches 138 from the slots 140. In the illustrated embodiment, the geared latch mechanism 16 provides leverage to facilitate the foregoing motions during engagement and disengagement of the cover 12 with the housing 14.

In accordance with embodiments, the static pin 20 described previously is attached to an extension 160 that extends from the housing 14 to a position beneath the geared latch mechanism 16. The static pin 20 extends upwardly through the longitudinal slot 43 in the receptacle 18 and into or through the gear rack member 50 to fix the position of gear rack member 50 while permitting the receptacle 18 and cover 12 (being attached) to move in response to applying an upward force 144 to the geared latch 70 as in FIG. 7. As shown, the geared latch 70 rotates outwardly from the cover 12.

After sufficient movement of the cover 12, the latches 138 disengage from the slots 140 such that the cover 12 can be removed from the housing 14. Removing the cover 12 from the housing 14 also separates the geared latch mechanism 16 from the static pin 20. To join the cover 12 and the housing 14, the geared latch mechanism 16 (attached to the housing) is aligned with the static pin 20. Specifically, the static pin 20 is inserted through the longitudinal slot 43 of the receptacle 18 and into the recess 56 of the gear rack member 50. Once the static pin 20 is inserted in to the recess 56 of the gear rack member 50, a reverse motion to the upward force 144 enables the cover 12 to engage and interlock with the housing 14 (e.g., using latches 138 and corresponding latch slots 140). Accordingly, the geared latch mechanism 16, the static pin 20, the latches 138, and the latch slots 140 facilitate tool-free and leveraged attachment and detachment of the cover 12 with the housing 14.

Figure 8:
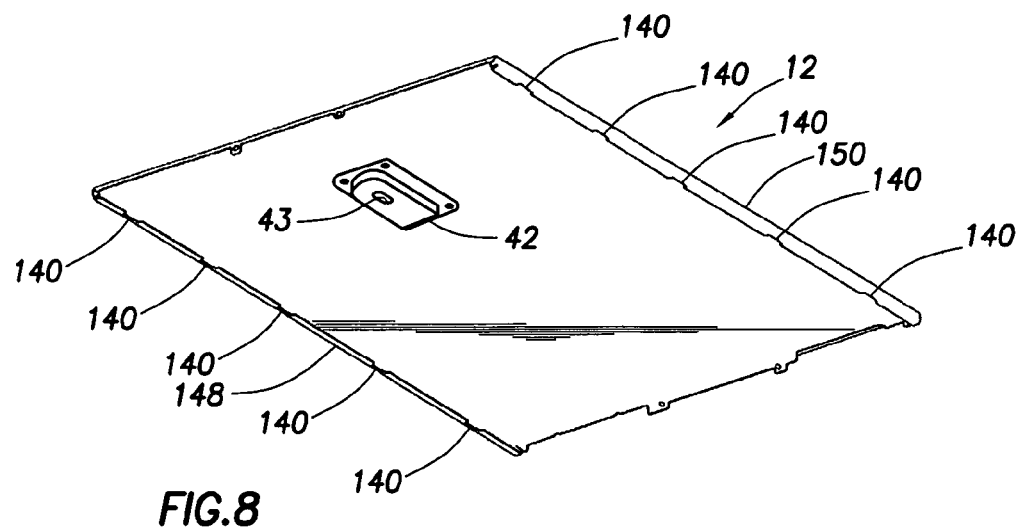
FIG. 8 shows a bottom perspective view of a device's access hood or cover with the geared latch mechanism attached in accordance with embodiments.
Figure 9:
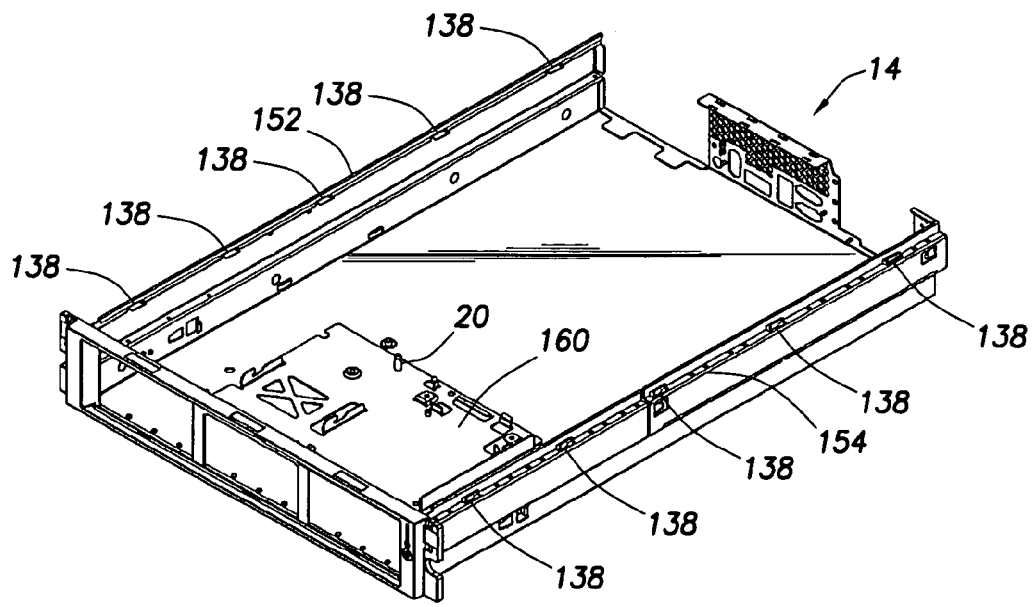
FIG. 9 shows a top perspective view of a device's chassis or housing in accordance with embodiments.

FIGS. 8 and 9 are perspective views of the cover 12 and the housing 14 disassembled from one another. As illustrated, the latch slots 140 are preferably disposed along opposite sides 148 and 150 of the cover 12, while the hooks or latches 138 are disposed along opposite sides 152 and 154 of the housing 14. FIG. 9 also shows the static pin 20 extending outwardly from the extension 160 of the housing 14. Although the illustrated embodiments show the latch slots 140 being part of the cover 12 and the latches 138 being part of the housing 14, other embodiments are possible. For example, the latch slots 140 may be part of the housing 14 and the latches 138 part of the cover 12.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus, comprising:
   a housing;
   a cover removably attached to the housing;
   a static pin attached to the housing, wherein the static pin is engaged within a recess of a gear rack member; and
   a geared latch assembly attached to the cover, the geared latch assembly including the gear rack member and having a monolithic latch member;
   wherein the latch member comprises a non-geared end, a geared end opposite the non-geared end, the geared end including a plurality of gear teeth circumferentially disposed about an axis of rotation; and wherein rotation of both the non-geared end and the geared end of the latch member from a first position to a second position about the axis of rotation causes the cover to slide from a closed state to an open state.

2. The apparatus of claim 1 wherein rotation of the non-geared end and the geared end of the latch member from the second position to the first position about the axis of rotation causes the cover to move linearly from the open state to the closed state.

3. The apparatus of claim 1 wherein the geared latch assembly further comprises a gear rack member that interfaces with the geared end of the latch member and the housing to translate rotational movement of the latch member to linear movement of the cover.

4. The apparatus of claim 3 further comprising a locking member between the latch member and the gear rack member, the locking member selectively prevents rotation of the geared latch.

5. The apparatus of claim 4 further comprising a rotator inserted through the latch member and into the locking member, the rotator enables the locking member to selectively rotate in and out of a slot in the gear rack member.

6. The apparatus of claim 3 wherein the gear rack member interfaces with the housing through the static pin.

7. The apparatus of claim 6 wherein the cover has an opening and wherein components of the geared latch assembly fit within an open-ended receptacle aligned with the opening;
wherein the receptacle includes a longitudinal slot;
wherein the static pin extends through the slot; and
wherein, if the latch member is rotated between the first position and the second position about the axis of rotation, the slot slides along the static pin.

8. The apparatus of claim 7 wherein the receptacle further comprises nubs and the gear rack member comprises slots, the gear rack member being positioned within the receptacle by alignment of the nubs with the slots.

9. The apparatus of claim 7 wherein the cover comprises a first set of connection points around the opening and wherein the receptacle comprises a rim having a second set of connection points for alignment and attachment to first set of connection point.

10. The apparatus of claim 7 wherein the receptacle is less than ½" deep.

11. The apparatus of claim 1 wherein rotation of the latch member involves a directional component that matches a slide direction of the cover.

12. The apparatus of claim 1 wherein the apparatus comprises a rack mountable computer.

13. The system of claim 1 wherein the non-geared end of the latch member is rotatable outwardly from the cover about the axis of rotation.

14. An apparatus comprising:
a housing;
a cover removably attached to the housing;
a receptacle attached to the cover, the receptacle including a longitudinal slot;
a geared latch assembly seated within the receptacle, wherein the geared latch assembly further comprises:
a monolithic latch member comprising a non-geared end and a geared end opposite the non-geared end, the geared end including a plurality of first gear teeth circumferentially disposed about an axis of rotation; and
a gear rack member including a recess and a plurality of second gear teeth;
a static pin attached to the housing such that the static pin is fixed in position relative to the housing, wherein the static pin extends through the longitudinal slot and is engaged within the recess;
wherein, rotation of both the non-geared end and the geared end of the latch member from a first position to a second position about the axis of rotation causes:
the plurality of first gear teeth to mesh with the plurality of second gear teeth;
the slot to slide along the static pin; and
the cover to slide from a closed state to an open state.

15. An apparatus, comprising:
a housing;
a cover removably attached to the housing;
a static pin attached to the housing, wherein the static pin is engaged within a recess of a gear rack member; and
a geared latch assembly attached to the cover, the geared latch assembly including the geared rack member and having a latch member;
wherein the latch member includes a one-piece body comprising a non-geared end and a geared end opposite the non-geared end, the geared end including a plurality of gear teeth circumferentially disposed about an axis of rotation; and
wherein rotation of the non-geared end of the body from a first position to a second position about the axis of rotation causes the cover to slide from a closed state to an open state.

16. The apparatus of claim 15 wherein rotation of the non-geared end of the body from the second position to the first position about the axis of rotation causes the cover to move linearly from the open state to the closed state.

* * * * *